United States Patent [19]
Larson et al.

[11] Patent Number: 5,383,340
[45] Date of Patent: Jan. 24, 1995

[54] TWO-PHASE COOLING SYSTEM FOR LAPTOP COMPUTERS

[75] Inventors: Ralph I. Larson, Bolton, Mass.; Richard L. Phillips, Alachua, Fla.; Alan F. Beane, Gilford, N.H.

[73] Assignee: Aavid Laboratories, Inc., S. Lancaster, Mass.

[21] Appl. No.: 217,387

[22] Filed: Mar. 24, 1994

[51] Int. Cl.$^6$ .............................................. F25D 23/12
[52] U.S. Cl. .................. 62/259.2; 361/700; 364/708.1
[58] Field of Search ............ 62/259.2; 165/80.3, 165/104.33; 361/688, 689, 700; 364/708.1

[56] References Cited

U.S. PATENT DOCUMENTS 4,980,848 12/1990 Griffin et al. .................. 361/688
4,997,032 3/1991 Danielson et al. .
5,000,256 3/1991 Tousignant .
5,030,793 7/1991 McCarthy .

*Primary Examiner*—John M. Sollecito
*Attorney, Agent, or Firm*—Cesari and McKenna

[57] ABSTRACT

A two-phase cooling system for a portable computer which in one embodiment consists of an evaporator which is positioned within the base of the computer and a condenser which is positioned within or attached to the lid of the computer. The evaporator and the condenser are connected by flexible tubing. The tubing may run externally from the lid to the base or it may extend through one or more of the hinges that connect the base and the lid. In an alternative embodiment, both the evaporator and the condenser of the two-phase system are incorporated into either the base or the lid of the computer.

31 Claims, 6 Drawing Sheets

TWO-PHASE COOLING SYSTEM FOR LAPTOP COMPUTERS

FIELD OF THE INVENTION

This invention relates generally to an apparatus for cooling electronic components included in a portable computer, such as a laptop, notebook, subnotebook and the like and, in particular, to a two-phase cooling apparatus for such a computer.

BACKGROUND OF THE INVENTION

Portable computers such as laptops, notebooks, subnotebooks and so forth (referred to herein generally as laptop computers) today utilize as system processors integrated circuit chips that can be cooled by natural convection or by included forced air cooling systems. Natural convection adequately cools "low-to-mid-power" microprocessor chips, while the included forced air cooling systems cool "mid-to-high-power" microprocessor chips. The forced air cooling systems use relatively small, and relatively quiet, fans that are readily incorporated into the laptop computers.

The next generations of microprocessors which manufacturers are contemplating using in laptop computers are higher power, higher density circuits. Moreover, these processors operate at higher speeds. They thus dissipate substantially more heat than the prior mid-power circuits. Accordingly, they can no longer be adequately cooled by the forced air cooling systems currently used to cool these computers. Forced air cooling systems that could potentially cool these high-power circuits are too large, too heavy, consume too much battery power and/or are too noisy for the laptop computers. These processors instead require their own, i.e., dedicated, cooling systems.

One type of dedicated cooling system uses a liquid coolant that changes phase as it absorbs heat. That is, the coolant changes from a liquid to a vapor as heat is transferred from the circuit to the coolant. It then changes from a vapor to a liquid as it transfers the heat to a cooler surface. Such systems are commonly referred to as two-phase systems.

The coolant in a two-phase system may be housed in a conventional heat pipe, which is a rigid tube with one end acting as an evaporator and the other end acting as a condenser. The end of the pipe which acts as the evaporator is placed in contact with the circuit and conducts heat, through its walls, from the circuit to the coolant. When sufficient heat has been transferred to the coolant, the coolant vaporizes and the vapor travels through the pipe to the condenser, where it dissipates heat and changes back to a liquid. A wick or other capillary device may be included to draw the liquid coolant back through the pipe to the evaporator.

Such conventional two-phase cooling systems generally work well. However, they take up a relatively large amount of space. If the device in which the cooling system is installed is a workstation, for example, the device has sufficient room to house a conventional two-phase cooling system that has a condenser which is large enough to cool a high power, high density processor. If, however, the device is a laptop computer, it may not have enough room for the components of such a two-phase system, and, in particular, it may not have room for the condenser. Further, as designers of the laptop computers endeavor to make newer models even more compact, and thus, easier to transport and handle, they reduce further the space allotted to the cooling system.

Laptop computers generally do not have the high quality screens that are now common on personal computers. These high quality screens require high power screen drivers, which must be adequately cooled to operate properly. Accordingly, what is needed is a cooling mechanism that fits within the confines of a laptop computer and can dissipate the heat produced by high power screen drivers, as well as the high power system processors, included therein.

SUMMARY OF THE INVENTION

The invention is a two-phase cooling system for a laptop computer which includes an evaporator that resides in close proximity to the circuitry to be cooled and a condenser that resides on the rear side of or within a housing for a display screen. The condenser can thus be as large in area as the screen housing, without limiting the space available for the processor circuitry and/or any related circuitry. The system includes flexible tubing that conveys vapor from the evaporator to the condenser and liquid coolant from the condenser to the evaporator.

A laptop computer includes a two-part case, with the parts rotatably connected together with hinges. A first part, generally the lid, houses a display screen and may also house heat-producing circuitry such as high power screen drivers. The second part, generally the base, houses the heat-producing system processing circuitry and a keyboard. The condenser may be affixed to the outside of the lid or it may be incorporated directly into the lid and thus reside in close proximity to a rear face of the screen. A condenser incorporated into the lid may include wicking which directs a portion of the liquid coolant along the screen and any heat-producing circuitry incorporated into the lid, to dissipate heat therefrom.

The two-phase cooling system preferably includes an evaporator with flexible walls, as discussed in a co-pending patent application Ser. No. 08/120,153 entitled Two-Phase Component Cooler. The evaporator, which may be constructed of metal or plastic, expands and contracts to maintain a constant ambient pressure within the system and thus, to provide required heat dissipation at all operating temperatures.

The tubing that connects the condenser and the evaporator may run externally between the evaporator included in the base and the condenser supported by or incorporated into the lid. Alternatively, the tubing may run between the sections internally, passing through the hinges.

In an alternative arrangement, all the components of the two-phase cooling system are incorporated into the base, i.e., the housing for the circuitry and the keyboard. This two-phase system consists of an elongated, flattened heat pipe with an evaporator formed along one of the sides of the flattened pipe and a condenser formed along an opposite side. Internal wicking along the evaporator side draws liquid coolant to the portion of the pipe that is proximate to the circuitry to be cooled. As the coolant absorbs heat and vaporizes, it flows to the condenser side.

In another alternative arrangement, all components of the two-phase system, as well as all high-power heat producing circuitry, are contained in the lid. The two-phase system consists of a flattened pipe, as described above.

These compact, two-phase cooling systems make efficient use of the existing space in laptop computers. They are also capable of cooling high density, high power circuitry included in these computers. Further, in a computer that incorporates the condenser into the screen housing, the same system can be used to cool the screen.

These cooling systems are extremely reliable. They are not mechanical, and thus, they have no moving parts which may fail. Further, the systems do not consume battery power, which is often at a premium in laptop computers.

BRIEF DESCRIPTION OF THE DRAWINGS

The above and further advantages of the invention may be better understood by referring to the following description in conjunction with the accompanying drawings, in which.

DETAILED DESCRIPTION

Figure 1:
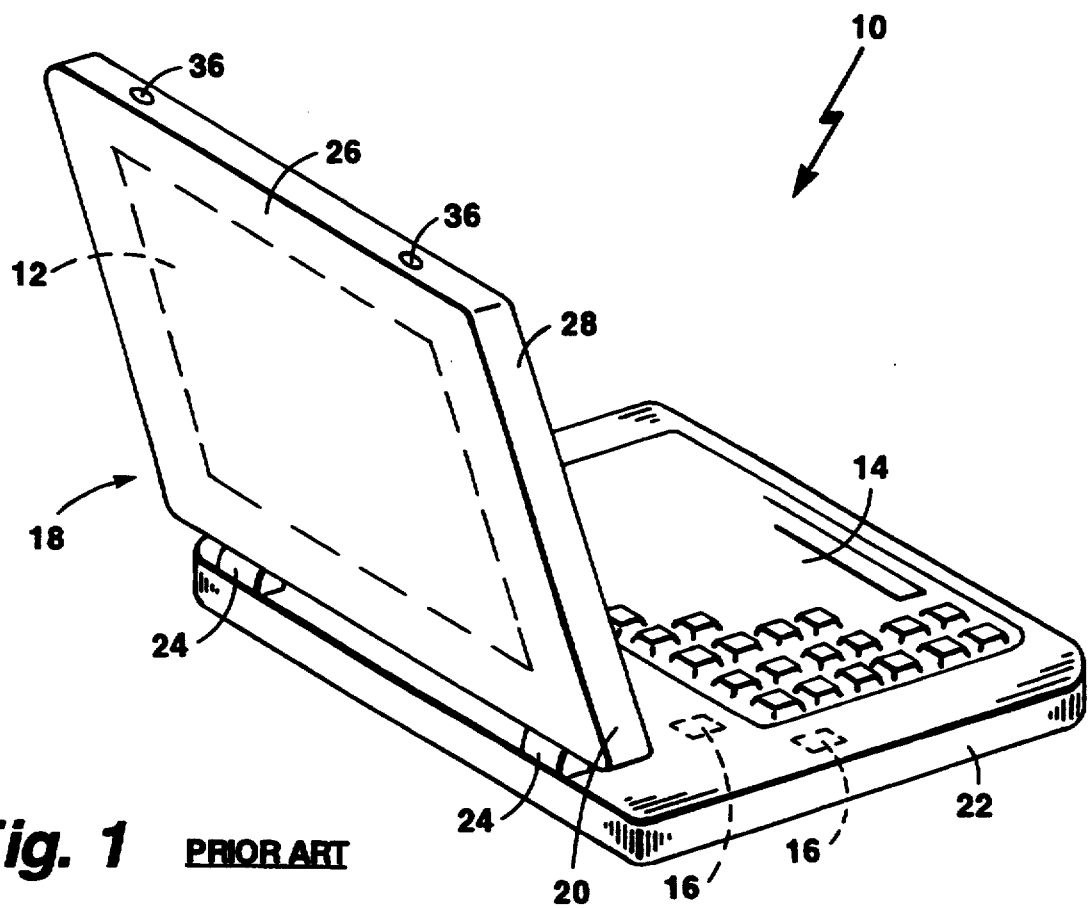
FIG. 1 depicts a conventional laptop computer.

FIG. 1 depicts a conventional laptop computer 10, which consists of a screen 12 (depicted by dotted lines), a keyboard 14 and electronic circuitry 16 (depicted, also, by dotted lines). These components of the computer are housed in a case 18 that includes a lid 20, which holds the screen 12, and a base 22 that holds the keyboard 14, the computer's electronic circuitry 16 and a forced air cooling system (not shown) for the circuitry, as needed. The lid and base 20 and 22 of the case 18 are connected by hinges 24, which are rotated to raise and lower the lid 20 relative to the base 22, to open and close the case 18. Additional circuitry, such as screen drivers (not shown), may be included in the lid.

The lid 20 includes a top wall 26 and four side walls 28. One of the side walls 28 may include one or more vents 36, to allow air heated by the screen 12 and any included circuitry to escape.

Figure 2:
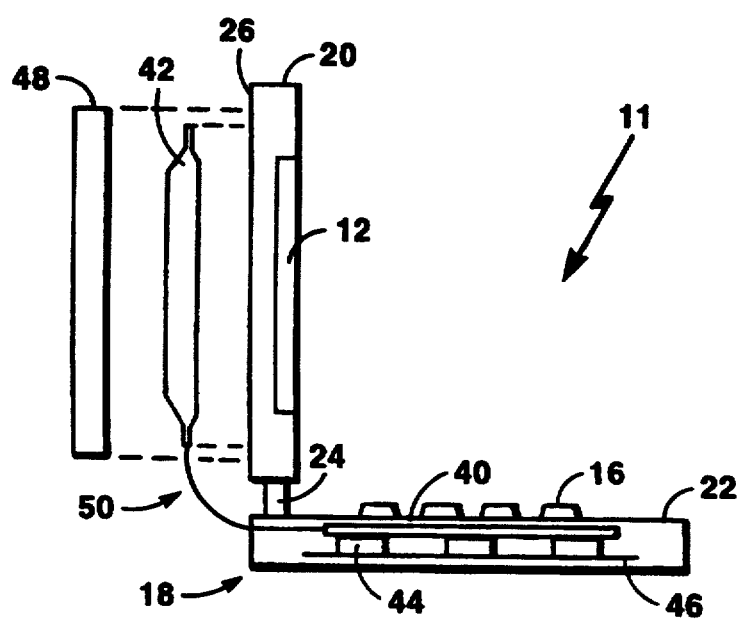
FIG. 2 is an exploded, cross-sectional side view of a laptop computer constructed in accordance with a first embodiment of the invention.

FIG. 2 depicts an exploded, cross-sectional side view of a laptop computer 11 which is a modified version of the laptop computer 10 of FIG. 1. The computer 11 includes all the elements of the computer 10, except any forced air cooling system that may be included in the base 22. This computer 11 includes instead a two-phase cooling system of the type discussed in the co-pending patent application Ser. No. 08/120,153 entitled Two-Phase Component Cooler, which is incorporated herein by reference. Such a cooling system includes an evaporator 40 and a condenser 42 that are interconnected with flexible tubing 50.

The evaporator 40 resides in the base 22, in thermal contact with the circuitry 16 to be cooled. The evaporator 40 may be sized to a particular integrated circuit 44 or it may be sized to a circuit board 46 which supports one or more of such circuits. Preferably, the evaporator 40 has flexible walls such that it maintains, over a wide-range of operating temperatures, a constant pressure within the system.

Figure 3:
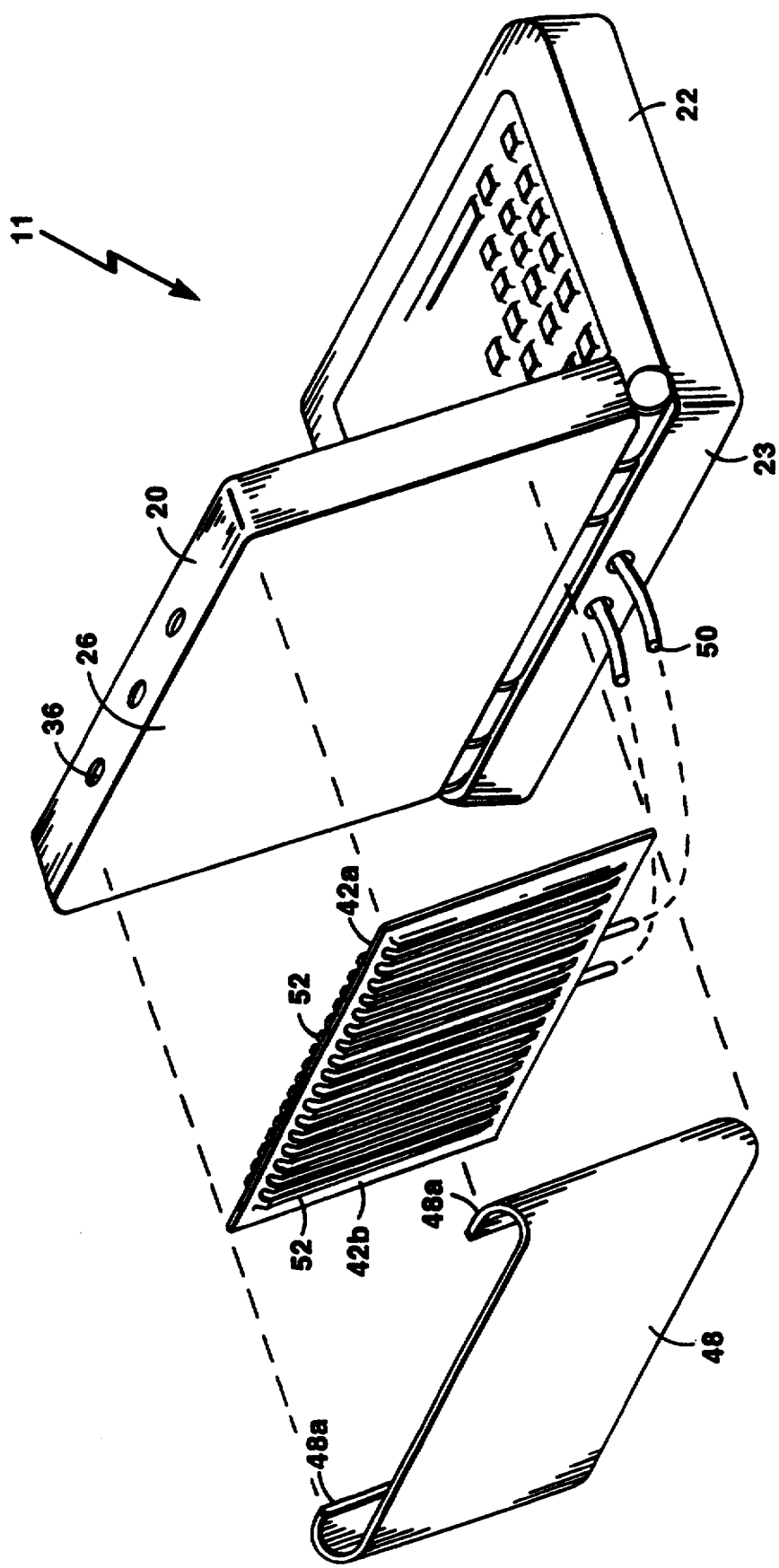
FIG. 3 is an alternative view of the laptop computer depicted in FIG. 2.

Referring also to FIG. 3, the condenser 42 is supported by the exterior side of the top wall 26 of the lid 20. A bracket 48 with curved ends 48a attaches to the top wall 26 and holds the condenser 42 in place. The bracket 48 is open ended such that air flow is directed past the condenser 42, to aid in heat dissipation therefrom. The condenser 42 preferably includes heat fins 52 on both a front wall 42a and back wall 42b, to enhance heat dissipation.

The flexible tubing 50 runs from the evaporator 40, through a side wall 23 of the base 22 to the condenser 42. The tubing 50 carries vaporized coolant from the evaporator 40 to the condenser 42. As the condenser 42 dissipates heat from the coolant and returns the coolant to its liquid state, the tubing 50 provides a path for the flow of liquid coolant back to the evaporator 40. The tubing 50 must be long enough and/or flexible enough to accommodate the relative movement of the lid 20. Preferably, the tubing 50 is made of a plastic which can withstand repeated flexing, rotating and stretching without tearing or cracking. The tubing 50 may form a single path between the condenser 42 to the evaporator 40, with the liquid coolant flowing along the sides of the tubing and vapor flowing through the center. The tubing may also include wicking (not shown) to direct the flow of the liquid coolant.

Figure 4:
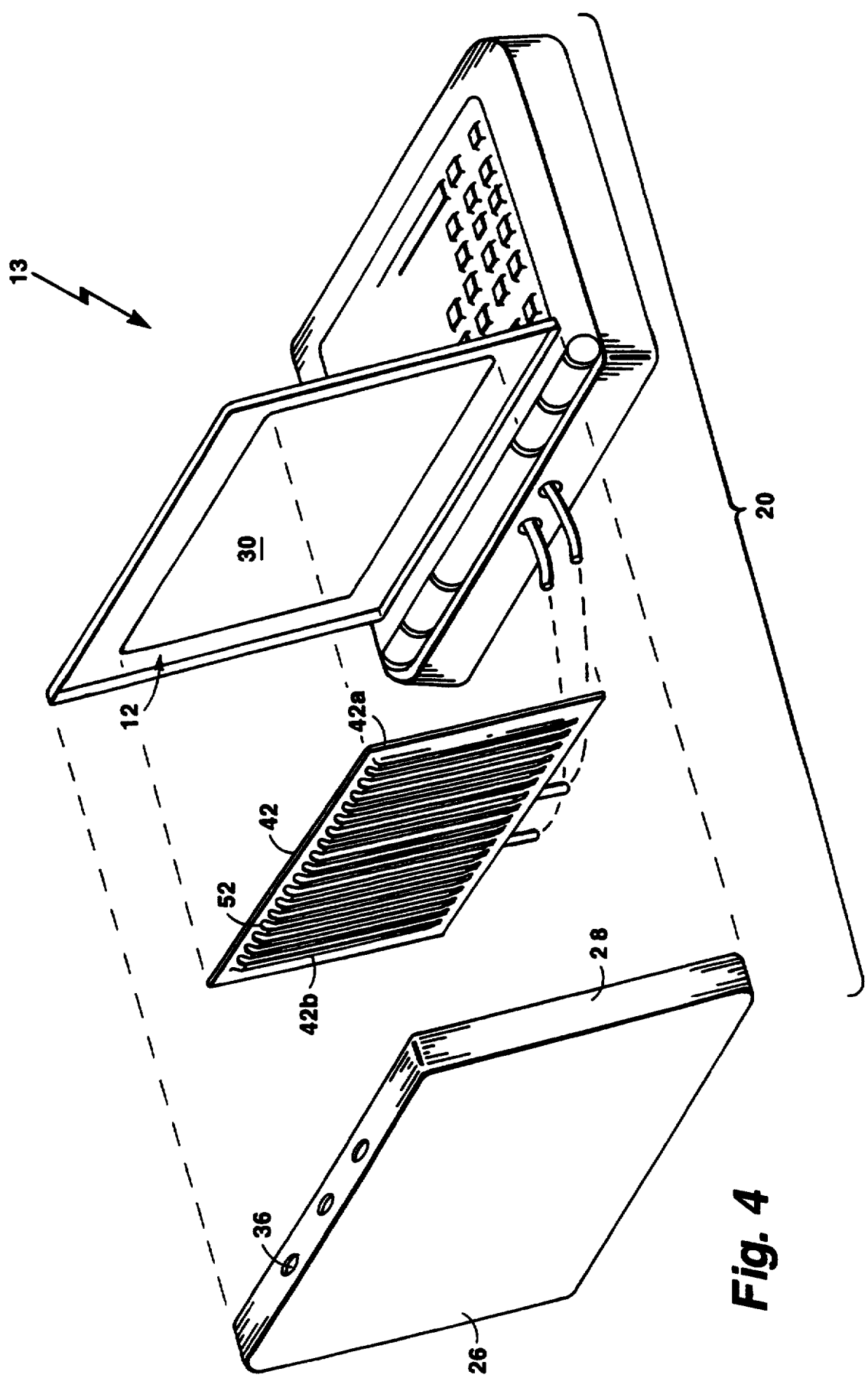
FIG. 4 is an exploded view of a laptop computer constructed in accordance with a second embodiment of the invention.

FIG. 4 depicts an alternative embodiment 13 of the laptop computer 11 shown in FIG. 3. In this embodiment 13, the condenser 42 is incorporated into the lid 20, rather than being supported externally by the lid. The condenser 42 is thus positioned proximate to a rear face 30 of the screen 12. As is also shown in FIG. 5, vents 36 and 37 in the upper and lower sides 28 of the lid 20 direct air flow past the condenser 42.

Figure 6:
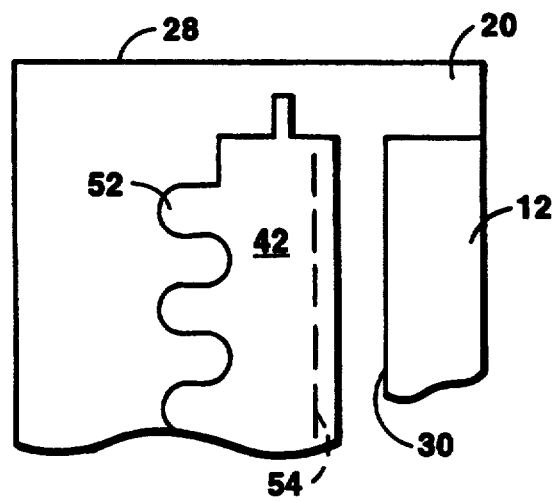
FIG. 6 depicts in more detail a portion of a condenser included in the laptop computer of FIG. 5.

If the screen 12 and any related circuitry (not shown) produce a relatively large amount of heat during use, the condenser 42 may also be used to cool the screen 12 and the circuitry. The condenser 42 thus includes heat fins 52 on the rear wall 42b and includes internal wicking 54 along the front wall 42a. Alternatively, if only particular portions, or areas, of the screen require cooling, heat fins may be included on the front wall 42a opposite those portions of the screen not requiring cooling. Such a condenser is depicted in more detail in FIG. 6, which is a cross-sectional side view of a portion of the lid 20. In such a system, the wicking 54 draws toward the screen a portion of the liquid coolant that would otherwise flow, under the force of gravity, through the tubing 50 to the evaporator 40. The coolant flowing through the wick 54 absorbs heat from the screen 12 and/or the related circuitry and again turns to vapor. It then flows toward the rear wall 42b of the condenser 42 for cooling. The portion of the liquid coolant that flows through the tubing 50 to the evaporator 40 similarly absorbs heat and returns, through the tubing 50, to the condenser as vapor.

Figure 5:
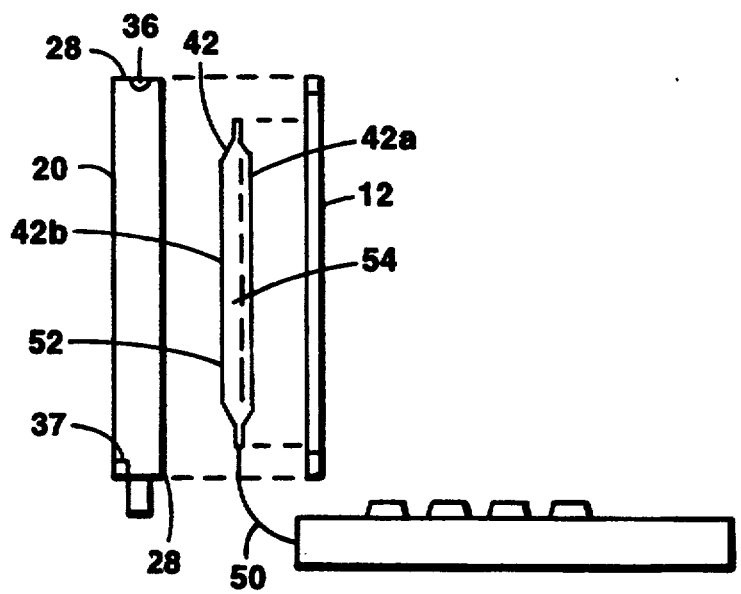
FIG. 5 is an exploded cross-sectional side view of the laptop computer depicted in FIG. 4.
Figure 7:
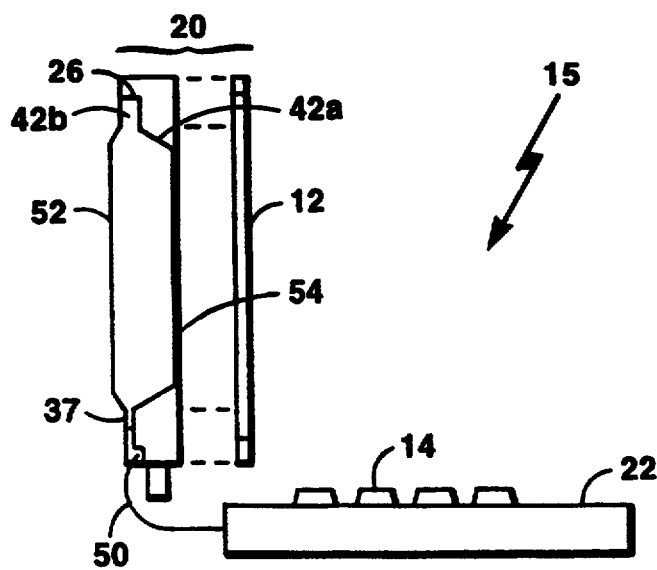
FIG. 7 is an exploded cross-sectional side view of a third alternative embodiment of the invention.

FIG. 7 depicts an alternative embodiment 15 of the computer 13 of FIGS. 4 and 5. In this embodiment, the rear wall 42b of the condenser 42 is formed as an integral part of the top wall 26 of the lid 20. The top wall 26 thus preferably includes the heat fins 52. The front wall 42a of the condenser may or may not include heat fins, as discussed above with reference to FIGS. 4–6.

Figure 8:
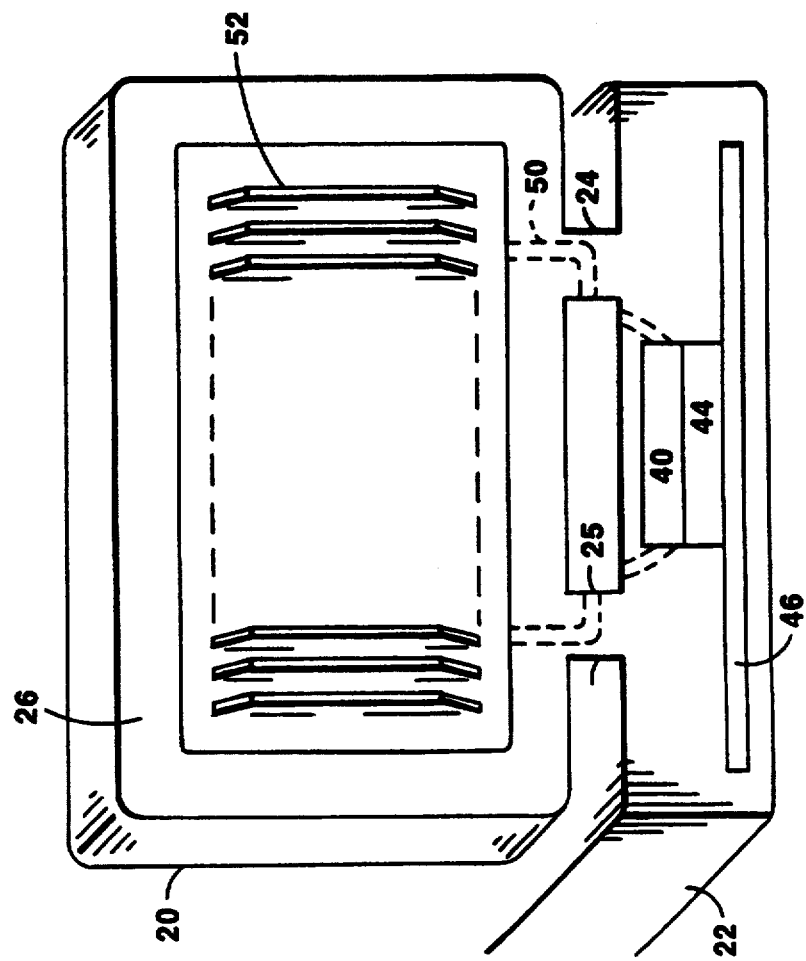
FIG. 8 is a rear view of the laptop computer of FIG. 7.

FIG. 8 depicts the computer 15 from the rear, illustrating in more detail the top wall 26 with integral heat fins 52. This drawing also depicts an alternative arrangement of the tubing 50 (depicted by dotted lines), with the tubing running internally between the lid 20 and the base 22. The tubing 50 runs through the hinge pins 25, and thus flexes as the hinges 24 rotate.

Figure 9:
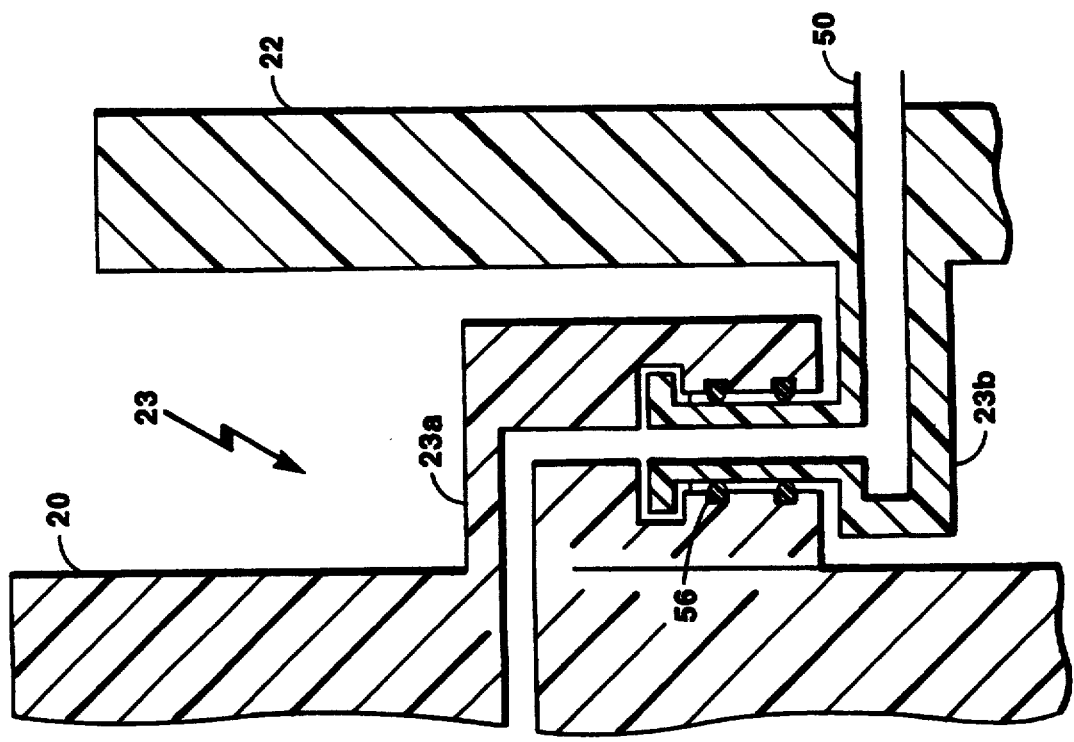
FIG. 9 is a cross-sectional top view of a hinge included in the laptop computer of FIG. 8.

FIG. 9 is a top view of a rotary hinge 23, with the tubing 50 extending through it. This hinge 23 may be used in place of one or both of the hinges 24. The hinge 23 includes two interlocking sections 23a and 23b, that rotate relative to one another to open and close the lid 20. O-rings 56 are included to seal together the two sections 23a and 23b of the hinge 23, to prevent leaking.

The laptop computers may be operated within a somewhat limited range of orientations. They may, for example, be placed on a titled surface. However, since the screens are attached to the bases, the bases are not typically turned on their sides, as a workstation may be, to conserve space. Accordingly, the cooling systems for the laptop computers, and in particular, the cooling systems using gravity to draw the liquid coolant from the condenser to the evaporator must be designed to operate properly at those orientations in which the laptop is likely to be used. For example, the condenser must be designed such that the outlets for the tubing properly route the liquid coolant from the condenser under the force of gravity. The tubing must also be appropriately routed between the condenser and the evaporator, through the hinges holding the lid to the base if appropriate, to direct the liquid coolant to the evaporator.

Figure 10:
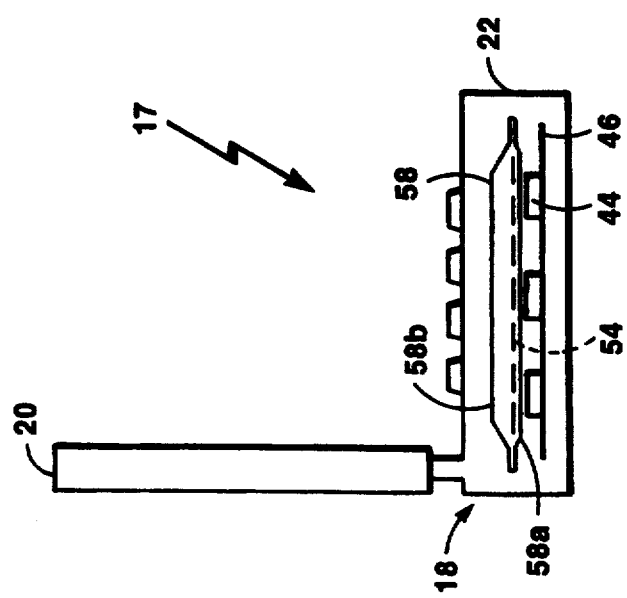
FIG. 10 is a cross-sectional side view of a laptop computer constructed in accordance with a fourth embodiment of the invention.

FIG. 10 depicts in cross-sectional side view another embodiment 17 of the laptop computer, with both the condenser 42 and the evaporator 40 enclosed within the base 20. The evaporator 40 and the condenser 42 may be part of the same elongated, flattened pipe 58, as depicted in the drawing or may be separate, similarly-shaped components. The flattened pipe 58 resides proximate to the circuit board 46 that contains the circuitry 44 to be cooled. The evaporator 40, which is formed on one of the elongated sides 58a, includes the wicking 54 that draws the liquid coolant toward the circuitry 44. The coolant absorbs heat from the circuitry, turns to a vapor and flows to the condenser 42, which is formed on the opposite elongated side 58b. This side 58b dissipates heat from the coolant, preferably with the help of the heat fins 52. The coolant changes state back to a liquid and is then drawn by the wicking to the evaporator 40 on side 58a.

Figure 11:
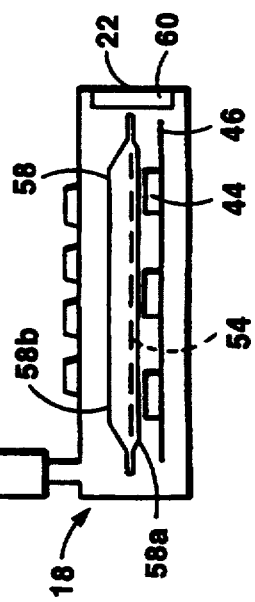
FIG. 11 is a cross-sectional side view of a laptop computer which includes both a two-phase cooling system and a fan.

As depicted in FIG. 11, a small fan 60 may be added to the laptop computer of FIG. 10, to increase the cooling capacity of the system. The condenser in this system is not as efficient as the condensers in the systems discussed above which include the condenser in or on the lid. Accordingly, this system may require a fan. Alternatively, such a system may utilize a smaller condenser, with the fan, depending on the required rate of heat dissipation.

Figure 12:
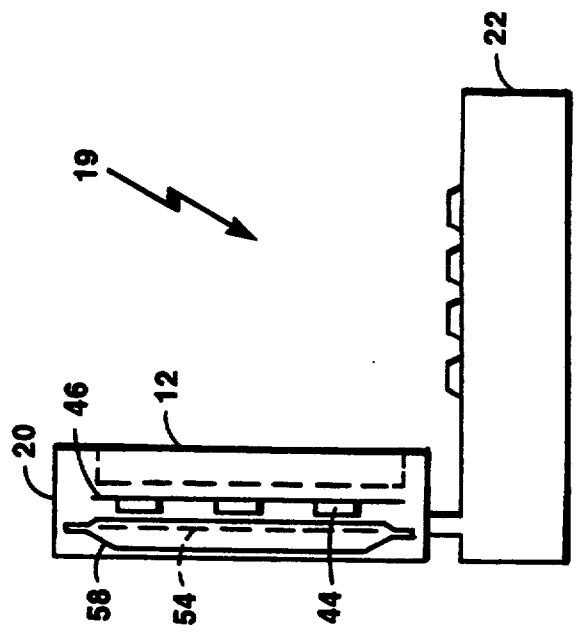
FIG. 12 is a cross-sectional side view of a laptop computer constructed in accordance with a fifth embodiment of the invention.

FIG. 12 depicts another alternative embodiment 19 of a laptop computer with all the high-power heat producing circuitry 16 in the lid 20. The two-phase cooling system, which is depicted as the flattened pipe 58, is also included in the lid. In this embodiment as in the embodiment depicted in FIG. 10, the tubing between the evaporator and the condenser is eliminated.

The foregoing description has been limited to specific embodiments of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A laptop computer including:
   A. case with a lid for housing a screen and a base for housing a keyboard and heat producing electronic circuitry;
   B. a two-phase cooling system with an evaporator and a condenser connected by tubing,
   wherein the evaporator is enclosed in the base and the condenser is attached to an external wall of the lid.

2. The laptop computer of claim 1, wherein the condenser includes a back wall and a front wall and further includes heat fins on at least one of the front wall and the back wall.

3. The laptop computer of claim 1, wherein the tubing extends from the evaporator, through the base and runs externally to the condenser.

4. The laptop computer of claim 1, wherein the lid includes a top wall for covering a rear face of the screen, and the condenser attaches to the top wall.

5. The laptop computer of claim 4, wherein system further includes a bracket for attaching the condenser to the top wall of the lid, the bracket including open ends to direct air past the condenser.

6. The laptop computer of claim 1, wherein the lid and base are rotatably connected by hinges and the tubing extends through the hinges.

7. A laptop computer including:
   A. a case with a lid for housing a screen and a base for housing a keyboard and heat producing electronic circuitry;
   B. a two-phase cooling system with an evaporator and a condenser connected by tubing,
   wherein the evaporator is enclosed within the base and the condenser is enclosed within the lid.

8. The laptop computer of claim 7, wherein the condenser includes a back wall and a front wall and further includes heat fins on at least one of the front wall and the back wall.

9. The laptop computer of claim 8, wherein the front wall of the condenser is proximate to the screen, and the condenser includes internal wicking that draws liquid coolant along the front wall, to absorb heat from the screen.

10. The laptop computer of claim 9, wherein the lid houses heat producing circuitry and the condenser is positioned relative to the heat producing circuitry to absorb heat therefrom.

11. The laptop computer of claim 9, wherein the condenser includes the heat fins on the back wall.

12. The laptop computer of claim 7, wherein the lid and base are rotatably connected by hinges and the tubing extends through the hinges.

13. The laptop computer of claim 7, wherein the tubing extends through a wall of the base and runs externally to a wall of the lid.

14. A laptop computer including:
   A. a case with
      i. a lid for housing a screen with a front face and a rear face, the lid including a top wall that covers the rear face of the screen, and
      ii. a base for housing a keyboard and heat producing circuitry; and
   B. a two-phase cooling system with
      i. an evaporator,
      ii. a condenser with a front wall and a back wall, and
      iii. tubing connecting the evaporator and the condenser, wherein the evaporator is enclosed within the base and the condenser is enclosed within the lid, the back wall of the condenser being integral with the top wall of the lid.

15. The laptop computer of claim 14, wherein the lid and the base are rotatably connected by hinges and the tubing extends through the hinges.

16. The laptop computer of claim 14, wherein the top wall of the lid includes heat fins.

17. The laptop computer of claim 16, wherein the front wall of the condenser includes heat fins.

18. The laptop computer of claim 16, wherein the front wall of the condenser is proximate to the rear face of the screen, the condenser including internal wicking that draws liquid coolant along the front wall of the condenser, to cool the screen.

19. The laptop computer of claim 18, wherein the lid includes heat producing circuitry and the condenser is positioned relative to the heat producing circuitry to absorb heat therefrom.

20. A two-phase cooling system for a laptop computer with a lid that houses a screen and a base that houses a keyboard and heat producing circuitry, the cooling system including:
   A. an evaporator shaped to fit within the base and proximate to the heat producing circuitry;
   B. a condenser with a front wall and a back wall;
   C. a bracket for attaching to the lid, the bracket holding the condenser; and
   D. tubing connecting the evaporator and the condenser.

21. The two-phase cooling system of claim 20, wherein the lid includes a top wall that covers a rear face of the screen and the bracket attaches internally to the top wall and the condenser is enclosed within the lid.

22. The two-phase cooling system of claim 20, wherein the condenser includes heat fins on at least one of the front wall and the back wall.

23. The two-phase cooling system of claim 22, wherein a back wall of the condenser includes heat fins and a front wall includes internal wicking that draws coolant past the rear face of the screen.

24. The two-phase cooling system of claim 20 wherein the bracket attaches externally to the lid.

25. A laptop computer including:
   A. a case with a lid for housing a screen and a base for housing a keyboard and heat producing electronic circuitry; and
   B. a two-phase cooling system with an interconnected evaporator and condenser, the evaporator residing in close proximity to the heat producing circuitry and the condenser being supported by the lid.

26. The laptop computer of claim 25 wherein the condenser is attached to an external wall of the lid.

27. The laptop computer of claim 25 wherein the condenser is enclosed within the lid.

28. The laptop computer of claim 27 wherein the condenser includes a front wall and a back wall and the front wall of the condenser is proximate to the screen, the condenser including internal wicking that draws liquid coolant along the front wall, to absorb heat from the screen.

29. The laptop computer of claim 26 wherein the lid and the base are rotatably connected by hinges and a means for interconnecting the evaporator and the condenser extends through the hinges.

30. The laptop computer of claim 25 wherein the condenser includes a front wall and a back wall, the condenser being enclosed within the lid and the back wall of the condenser being integral with a wall of the lid.

31. The laptop computer of claim 30 wherein the front wall of the condenser is proximate to a rear face of the screen and the condenser includes internal wicking that draws liquid coolant along the front wall of the condenser, to cool the screen.

* * * * *